US010056231B2

(12) United States Patent
Long et al.

(10) Patent No.: US 10,056,231 B2
(45) Date of Patent: *Aug. 21, 2018

(54) TCCT MATCH CIRCUIT FOR PLASMA ETCH CHAMBERS

(71) Applicant: Lam Research Corporation, Fremont, CA (US)

(72) Inventors: Maolin Long, Cupertino, CA (US); Ricky Marsh, San Ramon, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 466 days.

This patent is subject to a terminal disclaimer.

(21) Appl. No.: 14/698,589

(22) Filed: Apr. 28, 2015

(65) Prior Publication Data

US 2015/0235810 A1    Aug. 20, 2015

Related U.S. Application Data

(63) Continuation-in-part of application No. 13/658,652, filed on Oct. 23, 2012, now Pat. No. 9,293,353, which
(Continued)

(51) Int. Cl.
*C23C 16/00* (2006.01)
*H01L 21/306* (2006.01)
(Continued)

(52) U.S. Cl.
CPC ........ *H01J 37/32183* (2013.01); *H01J 37/20* (2013.01); *H01J 37/3211* (2013.01); *H01J 2237/334* (2013.01)

(58) Field of Classification Search
CPC ................. H01J 37/321; H01J 37/3211; H01J 37/32119; H01J 37/32128;
(Continued)

(56) References Cited

U.S. PATENT DOCUMENTS 5,571,366 A * 11/1996 Ishii .................. H01J 37/32082
118/723 I
5,770,982 A    6/1998 Moore
(Continued)

FOREIGN PATENT DOCUMENTS

CN        1909184        2/2007
CN        1909184 A      2/2007
(Continued)

OTHER PUBLICATIONS

English translation of Notification of Examination Opinions and Search Report issued in counterpart Taiwanese Application No. 102138115, dated Feb. 7, 2017.
(Continued)

*Primary Examiner* — Luz L Alejandro Mulero
*Assistant Examiner* — Luz L Alejandro
(74) *Attorney, Agent, or Firm* — Martine Penilla Group, LLP

(57) ABSTRACT

A match circuit includes the following: a power input circuit coupled to an RF source; an inner coil input circuit coupled between the power input circuit and an input terminal of an inner coil, the inner coil input circuit including an inductor and a capacitor coupled in series to the inductor, the inductor connecting to the power input circuit, and the capacitor connecting to the input terminal of the inner coil, a first node being defined between the power input circuit and the inner coil input circuit; an inner coil output circuit coupled between an output terminal of the inner coil and ground, the inner coil output circuit defining a direct pass-through connection to ground; an outer coil input circuit coupled between the first node and an input terminal of an outer coil; and an outer coil output circuit coupled between an output terminal of the outer coil and ground.

13 Claims, 7 Drawing Sheets

Related U.S. Application Data is a continuation-in-part of application No. 13/198,683, filed on Aug. 4, 2011, now Pat. No. 9,490,106, application No. 14/698,589, which is a continuation of application No. 13/751,001, filed on Jan. 25, 2013, now Pat. No. 9,059,678.

(60) Provisional application No. 61/480,314, filed on Apr. 28, 2011.

(51) Int. Cl.
*H01J 37/32* (2006.01)
*H01J 37/20* (2006.01)

(58) Field of Classification Search
CPC .......... H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 5,907,221 A * | 5/1999 | Sato | H01J 37/321 118/723 MP |
| 5,952,896 A | 9/1999 | Mett et al. | |
| 6,054,013 A * | 4/2000 | Collins | H01J 37/321 118/723 I |
| 6,254,738 B1 | 7/2001 | Stimson et al. | |
| 6,313,584 B1 | 11/2001 | Johnson et al. | |
| 7,218,899 B2 | 5/2007 | Sorrells et al. | |
| 7,480,571 B2 | 1/2009 | Howald et al. | |
| 7,539,474 B2 | 5/2009 | Sorrels et al. | |
| 7,780,814 B2 | 8/2010 | Pipitone et al. | |
| 7,811,410 B2 | 10/2010 | Leming et al. | |
| 7,868,556 B2 | 1/2011 | Xia | |
| 8,334,657 B2 | 12/2012 | Xia | |
| 2004/0027209 A1 | 2/2004 | Chen et al. | |
| 2006/0005928 A1 | 1/2006 | Howald et al. | |
| 2010/0314048 A1 * | 12/2010 | Long | H01J 37/321 156/345.48 |

FOREIGN PATENT DOCUMENTS

| | | |
|---|---|---|
| CN | 101035405 | 9/2007 |
| CN | 101073085 | 11/2007 |
| CN | 101073085 A | 11/2007 |
| CN | 101277579 | 10/2008 |
| TW | 200405660 A | 4/2004 |
| TW | 200809956 A | 2/2008 |
| TW | 200903628 A | 1/2009 |
| WO | 2006/044722 | 4/2006 |
| WO | 2006044722 A2 | 4/2006 |

OTHER PUBLICATIONS

Office Action issued in corresponding Chinese Application No. 201310503860.2, dated Feb. 1, 2016.
Office Action and Search Report issued in related Taiwanese Divisional Application No. 106130537, dated May 22, 2018 (11 total pages).

* cited by examiner

TCCT MATCH CIRCUIT FOR PLASMA ETCH CHAMBERS

CLAIM OF PRIORITY

This application claims priority as a continuation of U.S. application Ser. No. 13/751,001, filed Jan. 25, 2013, entitled "TCCT Match Circuit for Plasma Etch Chambers," which claims priority to U.S. Provisional Application No. 61/747,919, filed on Dec. 31, 2012, and entitled "TCCT Match Circuit for Plasma Etch Chambers." U.S. application Ser. No. 13/751,001 claims priority as a Continuation-in-Part of U.S. patent application Ser. No. 13/658,652, filed on Oct. 23, 2012, and entitled "Faraday Shield Having Plasma Density Decoupling Structure Between TCP Coiling Zones," which claims priority as a Continuation-in-Part of U.S. patent application Ser. No. 13/198,683, filed on Aug. 4, 2011, and entitled "Internal Faraday Shield Having Distributed Chevron Patterns and Correlated Positioning Relative to External Inner and Outer TCP Coil, which claims priority to U.S. Provisional Patent Application No. 61/480,314 filed on Apr. 28, 2011 and entitled "Internal Faraday Shield Having Distributed Chevron Patterns and Correlated Positioning Relative to External Inner and outer TCP Coil." The disclosures of these applications are incorporated herein by reference in their entirety for all purposes.

FIELD OF THE INVENTION

The present invention relates generally to semiconductor fabrication, and more particularly, to a TCCT match circuit for plasma etch chambers.

DESCRIPTION OF THE RELATED ART

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

A plasma contains various types of radicals, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

Existing transformer coupled capacitive tuning (TCCT) match designs suffer from a number of problems, especially when utilized to perform manufacturing processes for magneto-resistive random access memory (MRAM). Problems include a limited TCCT range, limited transformer coupled plasma (TCP) power, high coil voltages, and coil arcing. As a result, the process window of the reactor chamber can be quite limited, meaning that a variety of recipes cannot be accommodated. If a recipe out of the process window is forced to run, it may be aborted due to over voltage and/or over current interlocks, and even worse, may result in arcing of the TPC coil and destruction of the ceramic window and ceramic cross. Furthermore, a sputtering effect of the ceramic window due to capacitive coupling by the TCP coil can develop over time when terminal voltages are not well balanced. The result is sputtering of particles from the ceramic window that are subsequently deposited on the wafer, which may result in loss of yield. This effect can limit the operational longevity of the reactor to, for example, 500 RF hours of operation.

In view of the foregoing, there is a need for an improved TCCT match circuit for plasma etch chambers.

SUMMARY

Disclosed is an apparatus used in etching semiconductor substrates and layers formed thereon during the manufacturer of semiconductor devices. The apparatus is defined by TCCT match circuitry which controls the operation of TCP coils of a plasma processing chamber in which etching is performed.

In one embodiment, a match circuit coupled between an RF source and a plasma chamber is provided, the match circuit including the following: a power input circuit, the power input circuit coupled to an RF source; an inner coil input circuit coupled between the power input circuit and an input terminal of an inner coil, the inner coil input circuit including an inductor and a capacitor coupled in series to the inductor, the inductor connecting to the power input circuit, and the capacitor connecting to the input terminal of the inner coil, a first node being defined between the power input circuit and the inner coil input circuit; an inner coil output circuit coupled between an output terminal of the inner coil and ground, the inner coil output circuit defining a direct pass-through connection to ground; an outer coil input circuit coupled between the first node and an input terminal of an outer coil; an outer coil output circuit coupled between an output terminal of the outer coil and ground.

In one embodiment, the capacitor is a variable capacitor having a value of between about 150 pF to about 1500 pF; and the inductor has a value of about 0.3 uH to about 0.5 uH.

In one embodiment, the outer coil input circuit includes a second capacitor.

In one embodiment, the second capacitor is a variable capacitor having a rating of about 150 pF to about 1500 pF.

In one embodiment, the outer coil output circuit includes a second capacitor. In one embodiment, the second capacitor has a value of about 80 pF to about 120 pF. In another embodiment, the second capacitor has a value of about 100 pF+/−about 1%.

In one embodiment, the power input circuit includes a second capacitor coupled to the RF source, a second inductor coupled to the inner coil input circuit, a third capacitor coupled between the second capacitor and the second inductor, a second node being defined between the second capacitor and the third capacitor, and a fourth capacitor coupled between the second node and ground. In one embodiment, the second capacitor has a rating of about 5 pF to about 500 pF; the third capacitor has a rating of about 50 pF to about 500 pF; the second inductor has a value of about 0.3 uH to about 0.5 uH; and the fourth capacitor has a value of about 200 pF to about 300 pF. In one embodiment, the fourth capacitor has a value of about 250 pF+/−about 1%.

In another embodiment, a match circuit is provided, including the following: a power input circuit, the power input circuit coupled to an RF source; an inner coil input circuit coupled between the power input circuit and an input terminal of an inner coil, the inner coil input circuit including an inductor and a first capacitor coupled in series to the inductor, the inductor connecting to the power input circuit, and the first capacitor connecting to the input terminal of the inner coil, a first node being defined between the power input circuit and the inner coil input circuit; an inner coil output circuit coupled between an output terminal of the inner coil and ground, the inner coil output circuit defining a direct pass-through connection to ground; an outer coil input circuit coupled between the first node and an input terminal of an outer coil; an outer coil output circuit coupled between an output terminal of the outer coil and ground, the outer coil output circuit including a second capacitor having a value greater than about 100 pF.

In one embodiment, the first capacitor is a variable capacitor having a value of between about 150 pF to about 1500 pF; and the inductor has a value of about 0.3 uH to about 0.5 uH.

In one embodiment, the outer coil input circuit includes a third capacitor. In one embodiment, the third capacitor is a variable capacitor having a rating of about 150 pF to about 1500 pF.

In one embodiment, the power input circuit includes a third capacitor coupled to the RF source, a second inductor coupled to the inner coil input circuit, a fourth capacitor coupled between the third capacitor and the second inductor, a second node being defined between the third capacitor and the fourth capacitor, and a fifth capacitor coupled between the second node and ground. In one embodiment, the third capacitor has a rating of about 5 pF to about 500 pF; the fourth capacitor has a rating of about 50 pF to about 500 pF; the second inductor has a value of about 0.3 uH to about 0.5 uH; and the fifth capacitor has a value of about 200 pF to about 300 pF. In one embodiment, the fifth capacitor has a value of about 250 pF+/−about 1%.

In another embodiment, a match circuit is provided, including the following: a power input circuit, the power input circuit coupled to an RF source; an inner coil input circuit coupled between the power input circuit and an input terminal of an inner coil, the inner coil input circuit including an inductor and a first capacitor coupled in series to the inductor, the inductor connecting to the power input circuit, and the first capacitor connecting to the input terminal of the inner coil, a first node being defined between the power input circuit and the inner coil input circuit; an inner coil output circuit coupled between an output terminal of the inner coil and ground, the inner coil output circuit defining a direct pass-through connection to ground; an outer coil input circuit coupled between the first node and an input terminal of an outer coil, the outer coil input circuit includes a second capacitor; an outer coil output circuit coupled between an output terminal of the outer coil and ground, the outer coil output circuit including a third capacitor.

In one embodiment, the first capacitor is a variable capacitor having a rating of between about 150 pF to about 1500 pF; and wherein the inductor has a value of about 0.3 uH to about 0.5 uH.

In one embodiment, the second capacitor is a variable capacitor having a rating of about 150 pF to about 1500 pF.

In one embodiment, the third capacitor has a value of about 80 pF to about 120 pF. In one embodiment, the third capacitor has a value of about 100 pF+/−about 1%

In one embodiment, the power input circuit includes a fourth capacitor coupled to the RF source, a second inductor coupled to the inner coil input circuit, a fifth capacitor coupled between the fourth capacitor and the second inductor, a second node being defined between the fourth capacitor and the fifth capacitor, and a sixth capacitor coupled between the second node and ground. In one embodiment, the fourth capacitor has a rating of about 5 pF to about 500 pF; wherein the fifth capacitor has a rating of about 50 pF to about 500 pF; the second inductor has a value of about 0.3 uH to about 0.5 uH; and the sixth capacitor has a value of about 200 pF to about 300 pF. In one embodiment, the sixth capacitor has a value of about 250 pF+/−about 1%.

BRIEF DESCRIPTION OF THE DRAWINGS

The invention, together with further advantages thereof, may best be understood by reference to the following description taken in conjunction with the accompanying drawings.

DETAILED DESCRIPTION

Disclosed is a TCCT match circuit for use in etching semiconductor substrates and layers formed thereon during the manufacture of semiconductor devices. The TCCT match circuitry controls the operation of a TCP coil disposed over a dielectric window of a chamber in which etching is performed.

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

Figure 1:
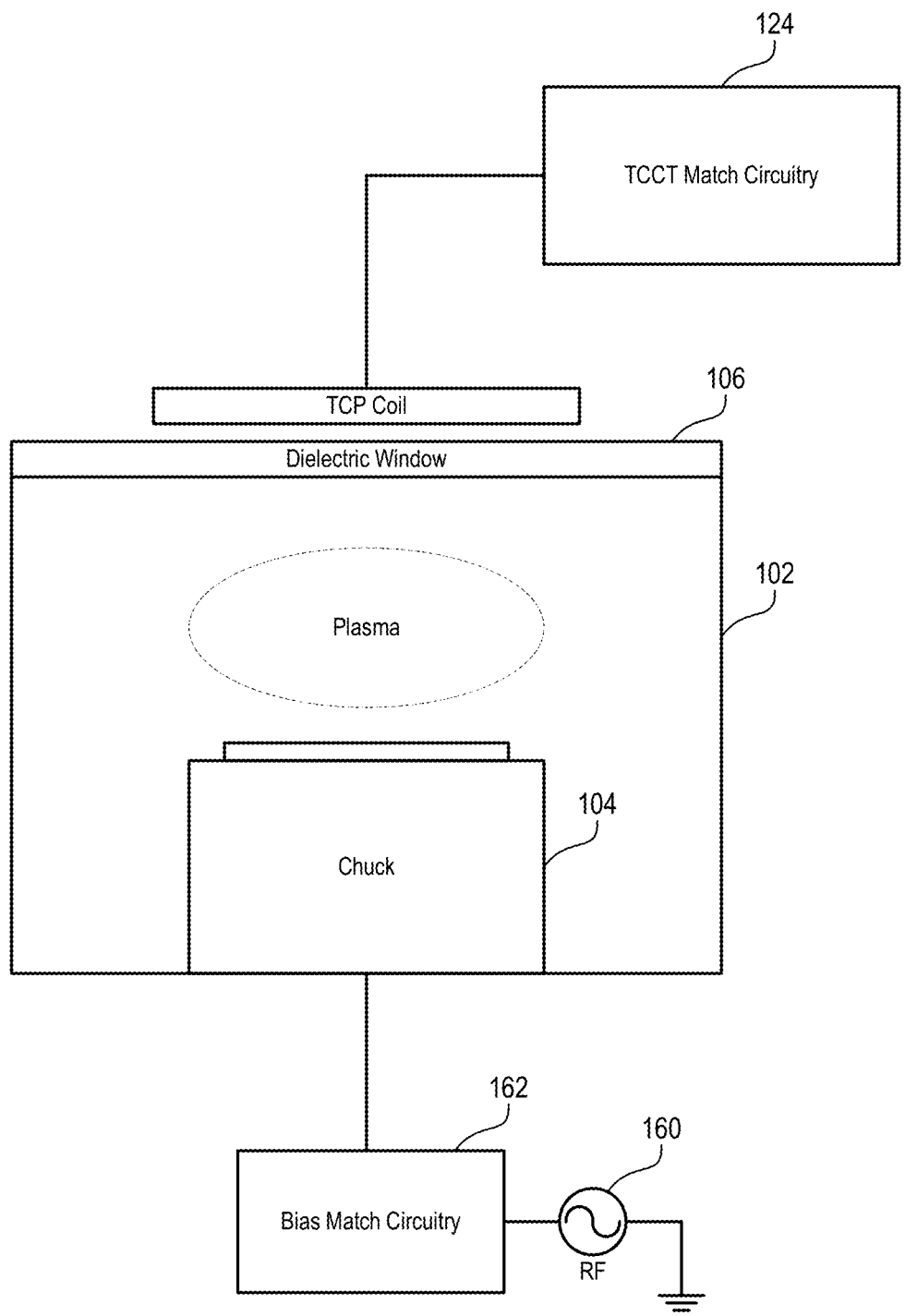
FIG. 1 illustrates a plasma processing system utilized for etching operations, in accordance with one embodiment of the present invention.

FIG. 1 illustrates a plasma processing system utilized for etching operations, in accordance with one embodiment of the present invention. The system includes a chamber 102 that includes a chuck 104, and a dielectric window 106. The chuck 104 can be an electrostatic chuck for supporting the substrate when present.

Further shown is a bias RF generator 160, which can be defined from one or more generators. If multiple generators are provided, different frequencies can be used to achieve various tuning characteristics. A bias match 162 is coupled between the RF generators 160 and a conductive plate of the assembly that defines the chuck 104. The chuck 104 also includes electrostatic electrodes to enable the chucking and dechucking of the wafer. Broadly, a filter and a DC clamp power supply can be provided. Other control systems for lifting the wafer off of the chuck 104 can also be provided. Although not shown, pumps are connected to the chamber 102 to enable vacuum control and removal of gaseous byproducts from the chamber during operational plasma processing.

The dielectric window 106 can be defined from a ceramic type material. Other dielectric materials are also possible, so long as they are capable of withstanding the conditions of a semiconductor etching chamber. Typically, chambers operate at elevated temperatures ranging between about 50 Celsius and about 120 Celsius. The temperature will depend on the etching process operation and specific recipe. The chamber 102 will also operate at vacuum conditions in the range of between about 1 m Torr (mT) and about 100 m Torr (mT). Although not shown, chamber 102 is typically coupled to facilities when installed in a clean room, or a fabrication facility. Facilities include plumbing that provide processing gases, vacuum, temperature control, and environmental particle control.

These facilities are coupled to chamber 102, when installed in the target fabrication facility. Additionally, chamber 102 may be coupled to a transfer chamber that will enable robotics to transfer semiconductor wafers into and out of chamber 102 using typical automation.

Figure 2:
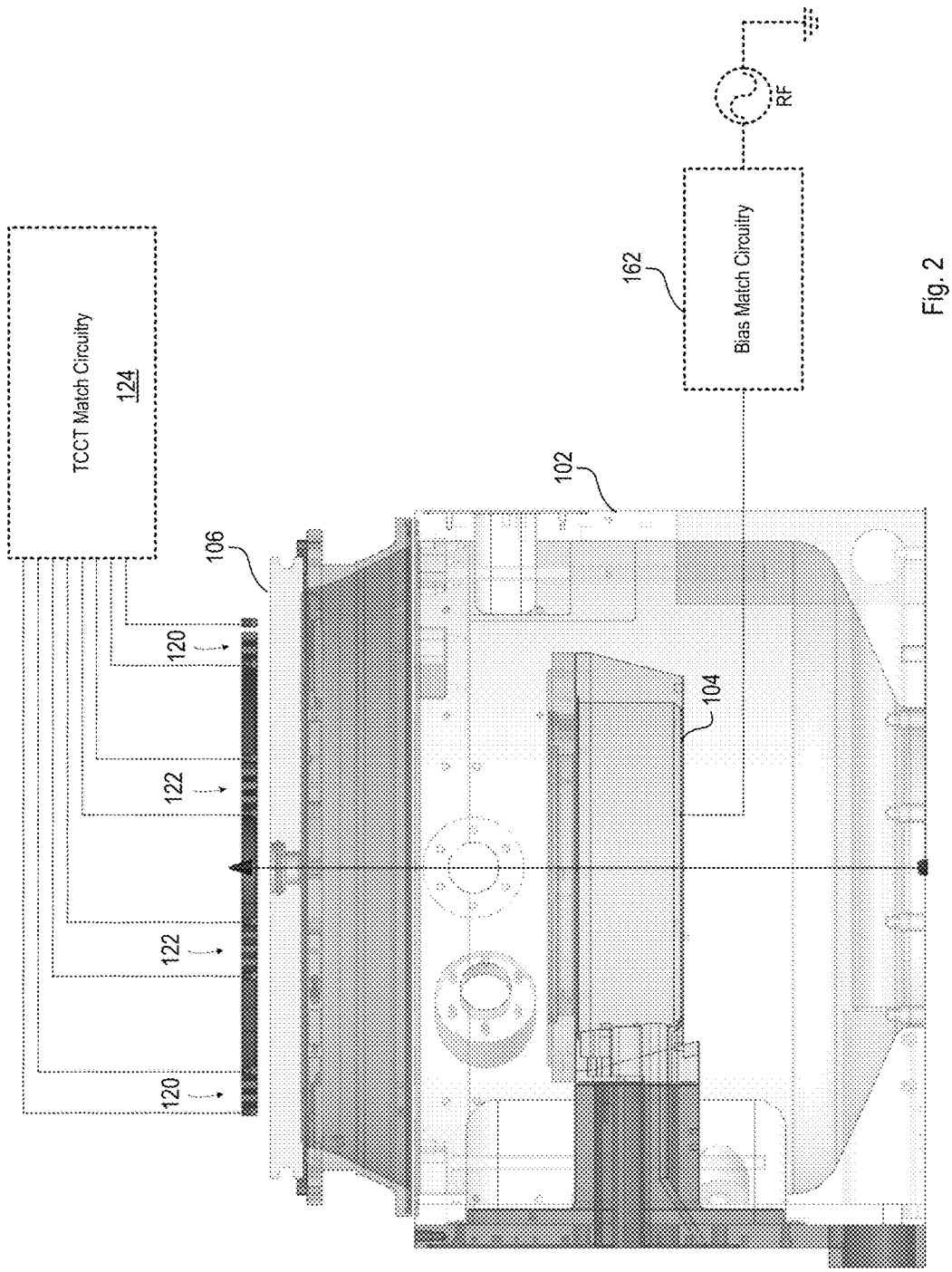
FIG. 2 is a cross-sectional view of a plasma processing chamber, in accordance with an embodiment of the invention.

FIG. 2 is a cross-sectional view of a plasma processing chamber, in accordance with an embodiment of the invention. The TCP coil is shown to include an inner coil (IC) 122, and an outer coil (OC) 120. The TCP coil is placed and arranged over the dielectric window 106.

TCCT match circuitry 124 enables dynamic tuning of power provided to the inner and outer coils. The TCP coil is coupled to the TCCT match circuitry 124 which includes connections to the inner coil 120, and outer coil 122. In one embodiment, the TCCT match circuitry 124 is configured to tune the TCP coil to provide more power to the inner coil 122 versus the outer coil 120. In another embodiment, the TCCT match circuitry 124 is configured to tune the TCP coil to provide less power to the inner coil 122 versus the outer coil 120. In another embodiment, the power provided to the inner coil and the outer coil will be to provide an even distribution of power and/or control the ion density in a radial distribution over the substrate (i.e., wafer, when present). In yet another embodiment, the tuning of power between the outer coil and the inner coil will be adjusted based on the processing parameters defined for that etching being performed on the semiconductor wafer disposed over chuck 104.

In one implementation, the TCCT match circuitry having variable capacitors (as discussed in further detail below) can be configured to be adjusted automatically to achieve a predetermined ratio of currents in the two coils. It should be understood that the circuits illustrated herein provide tuning and adjustment to the desired ratio of currents. In one embodiment, the ratio of currents can range from 0.1 to 1.5. Commonly, this ratio is referred to as the transformer coupled capacitive tuning (TCCT) ratio. The setting of the TCCT ratio, however, is based on the process that is desired for a particular wafer or wafers.

It should be appreciated that by providing a tunable TCP coil, the chamber 102 can provide flexibility for controlling ion density versus TCP power, and radial ion density profiles, depending on the processing operations being performed.

Additionally, it should be noted that although reference is made throughout the present disclosure to a TCCT match circuitry, the use of this terminology should not limit the scope of the circuitry defined to achieve the desired match function and provide for tuning. In other embodiments, it is contemplated that match circuitry in accordance with the principles and embodiments described herein can be applied to achieve a desired match function for plasma processing systems without TCCT functionality, or having a fixed TCCT ratio.

Figure 3:
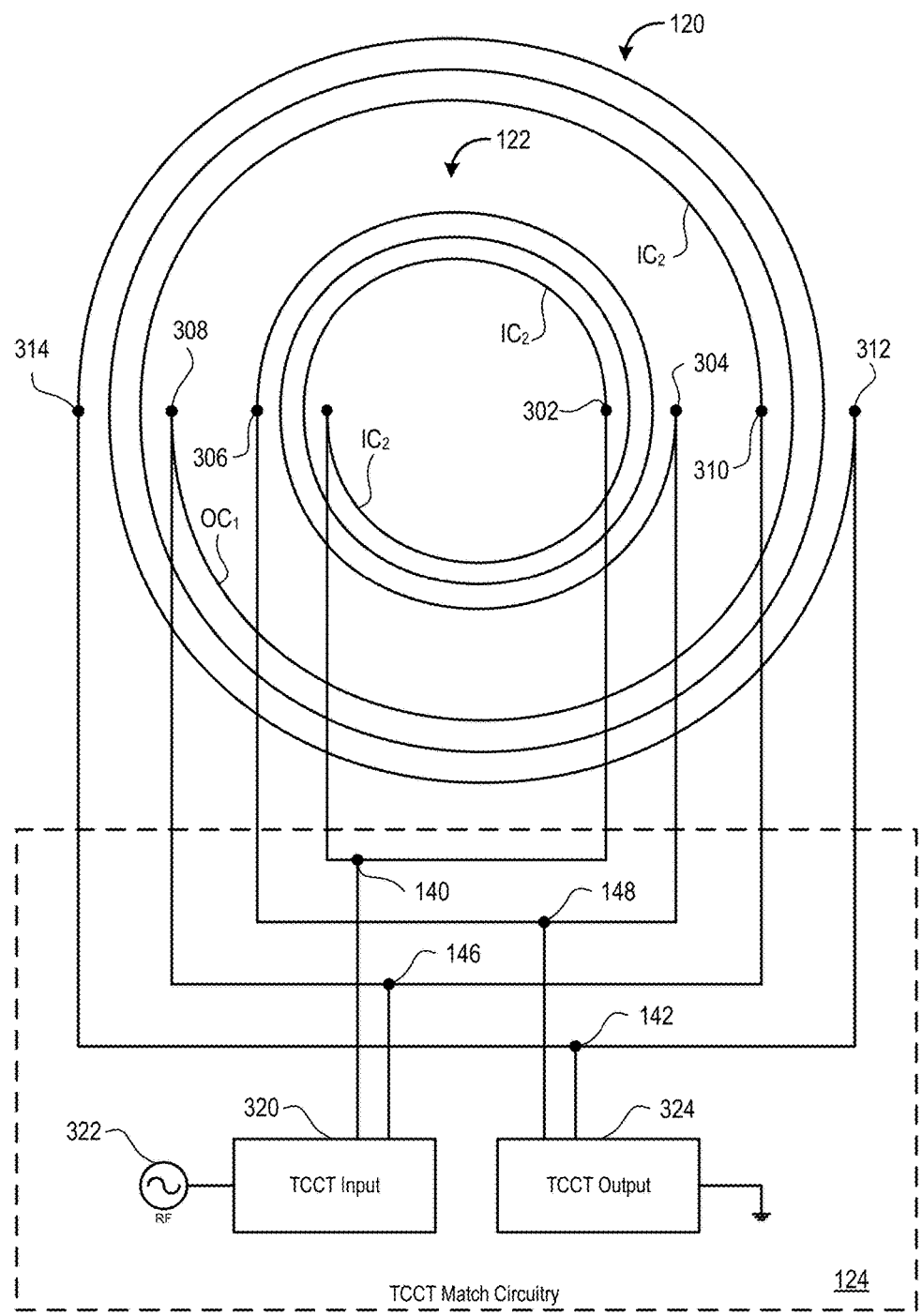
FIG. 3 illustrates a top view, schematically representing the inner coil and outer coil, in accordance with one embodiment of the present invention.

FIG. 3 illustrates a top view, schematically representing the inner coil 122 and outer coil 120, in accordance with one embodiment of the present invention. The top view shown represents the connections to the coil as previously described to include outer coil 120 and inner coil 122, as one example. The inner coil 122 will include an inner coil 1 ($IC_1$) and inner coil 2 ($IC_2$). The outer coil 120 includes an outer coil 1 ($OC_1$) and an outer coil 2 ($OC_2$). The connections between the coil ends are illustrated relative to the circuitry provided in the TCCT match circuitry 124. The illustration in FIG. 3 is provided to show the circular winding associated with each of the inner and outer coils of the TCP coil utilized in chamber 102, in accordance with one embodiment of the present invention. As shown, the inner coils $IC_1$ and $IC_2$ are arranged as parallel spirals that are interleaved with one another. As shown, $IC_1$ and $IC_2$ resemble a pair of arithmetic or Archimedean spirals of substantially the same shape but with one rotated by about 180 degrees about its axis relative to the other. An input terminal 300 of $IC_1$ is situated diametrically opposite input terminal 302 of $IC_2$. Additionally, an output terminal 304 of $IC_1$ is situated diametrically opposite output terminal 306 of $IC_2$. The configuration of the outer coils $OC_1$ and $OC_2$ is similar to that of the inner coils $IC_1$ and $IC_2$, defining substantially similar parallel spirals, interleaved with one another, and rotated by approximately 180 degrees relative to each other. An input terminal 308 of $OC_1$ is diametrically opposite input terminal 310 of $OC_2$, whereas output terminal 312 of $OC_1$ is diametrically opposite output terminal 314 of $OC_2$. In one embodiment, the input and output terminals of the inner coils and the outer coils are arranged in a substantially linear configuration. It should be appreciated that other types of coil configurations are possible. For example, it is possible to have a dimensional coil that provides a dome type structure, and other coil type structures other than flat coil distributions.

As has been noted, the TCP coil is coupled to the TCCT match circuitry 124 which includes connections to the inner coil 120, and outer coil 122. As shown, the outer coil 120 input terminals 308 and 310 are coupled to node 146, which in turn connects to TCCT input circuitry 320. The output terminals of the outer coil 120 are connected to node 142, which connects to TCCT output circuitry 324. The inner coil 122 has its input terminals 300 and 302 connected to node 140, which then connects to TCCT input circuitry 320. The output terminals 304 and 306 of the inner coil 122 are connected to node 148, which connects to TCCT output circuitry 324. The TCCT input circuitry receives power from an RF power source 322. The TCCT output circuitry is connected to ground.

Figure 4A:
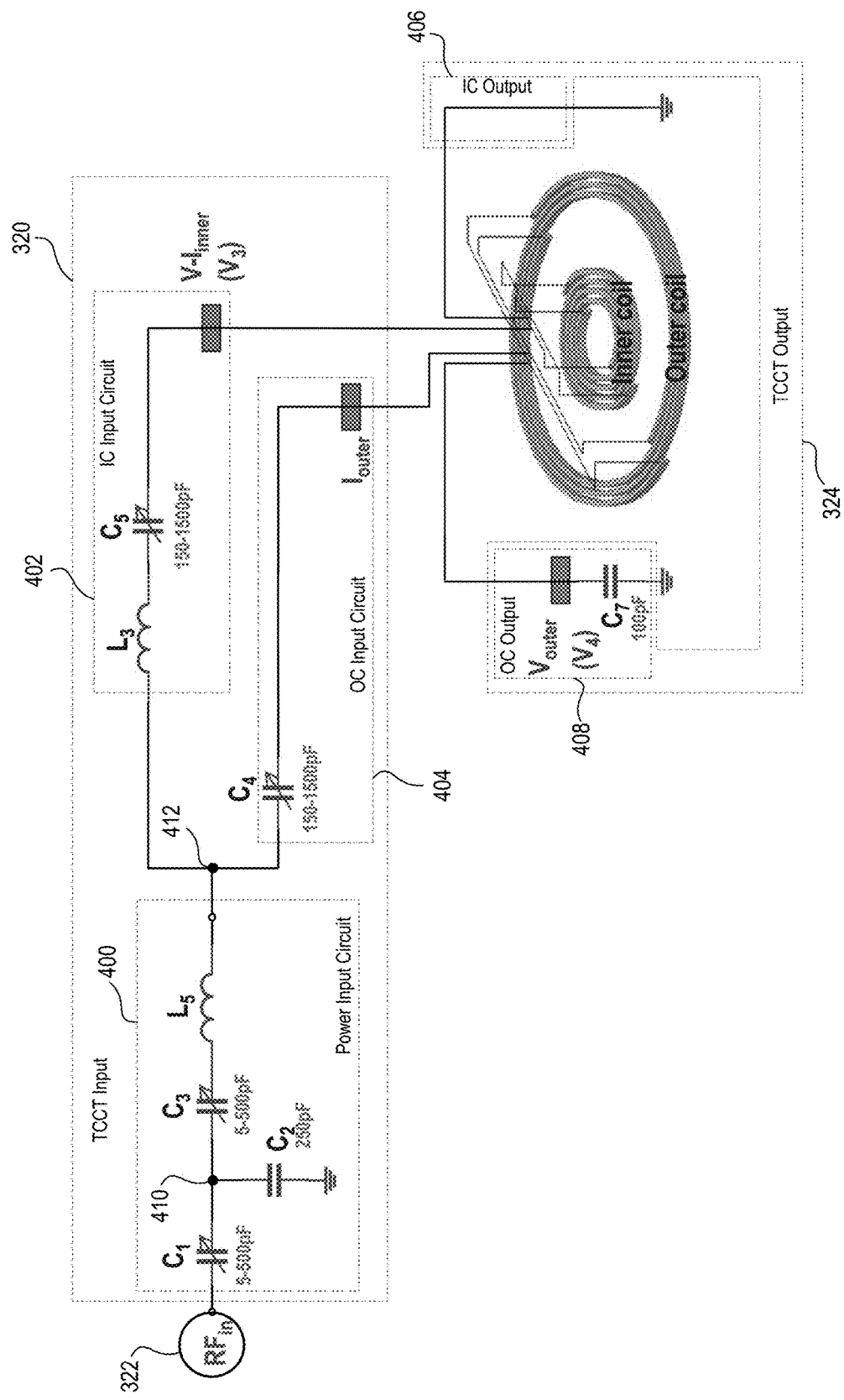
FIG. 4A is a schematic diagram illustrating the circuit topology of the TCCT match circuitry, in accordance with an embodiment of the invention.

FIG. 4A is a schematic diagram illustrating the circuit topology of the TCCT match circuitry, in accordance with an embodiment of the invention. The RF source 322 provides power to a power input circuit 400. A variable capacitor $C_1$ is coupled between the RF source 322 and a node 410. Node 410 connects to a capacitor $C_2$, that in turn is connected to ground. Node 410 also connects to a variable capacitor $C_3$, which in turn connects to an inductor $L_5$. Inductor $L_5$ is coupled to a node 412. In one embodiment, the power input circuit 400 is defined by the variable capacitor $C_1$, node 410, capacitor $C_2$ coupled to ground, the variable capacitor $C_3$ and the inductor $L_5$, arranged as has been described.

Node 412 is coupled to each of an inner coil input circuit 402 and an outer coil input circuit 404. In one embodiment, the inner coil input circuit 402 is defined by an inductor $L_3$ and a variable capacitor $C_5$, coupled to each other. The inductor $L_3$ is coupled between the node 412 and the variable capacitor $C_5$. The variable capacitor $C_5$ connects to node 140 (shown at FIG. 3), which in turn connects to the input terminals of the inner coils.

With continued reference to FIG. 4A, node 412 also connects to the outer coil input circuit 404. In one embodiment, the outer coil input circuit 404 is defined by a variable capacitor $C_4$ that couples to node 412. The variable capacitor $C_4$ also connects to node 146 (shown at FIG. 3), which in turn connects to the input terminals of the outer coils.

Additionally shown at FIG. 4A is the TCCT output circuitry 324, which is defined by inner coil output circuit 406 and outer coil output circuit 408. The inner coil output circuit 406 is connected to node 148 (shown at FIG. 3), which in turn connects to the output terminals of the inner coils. In one embodiment, the inner coil output circuit 406 is defined by a ground pass through. The outer coil output circuit 408 connects to node 142 (shown at FIG. 3), which in turn connects to the output terminals of the outer coils. In one embodiment, the outer coil output circuit is defined by a capacitor $C_7$ that is coupled between the node 142 and ground.

In one embodiment, the variable capacitor $C_1$ is rated at approximately 5 to 500 pF. In one embodiment, the capacitor $C_2$ is rated at approximately 250 pF. In one embodiment, the variable capacitor $C_3$ is rated at about 5 to 500 pF. In one embodiment, the inductor $L_5$ is rated at approximately 0.3 uH. In one embodiment, the variable capacitor $C_4$ is rated at approximately 150 to 1500 pF. In one embodiment, the inductor $L_3$ is rated at approximately 0.55 uH. In one embodiment, the variable capacitor $C_5$ is rated at approximately 150 to 1500 pF. In one embodiment, the capacitor $C_7$ is rated at approximately 100 pF.

TCCT match circuitry 124 enables dynamic tuning of variable capacitors $C_1$, $C_3$, $C_4$, and $C_5$ to tune the power provided to the inner and outer coils. In one embodiment, the variable capacitors $C_1$, $C_3$, $C_4$, and $C_5$ are controlled by processing controllers, connected to an electronics panel of chamber 102. The electronics panel can be coupled to networking systems that will operate specific processing routines that depend on the processing operations desired during specific cycles. The electronics panel can therefore control the etching operations performed in chamber 102, as well as control the specific settings of variable capacitors $C_1$, $C_3$, $C_4$, and $C_5$.

Figure 4B:
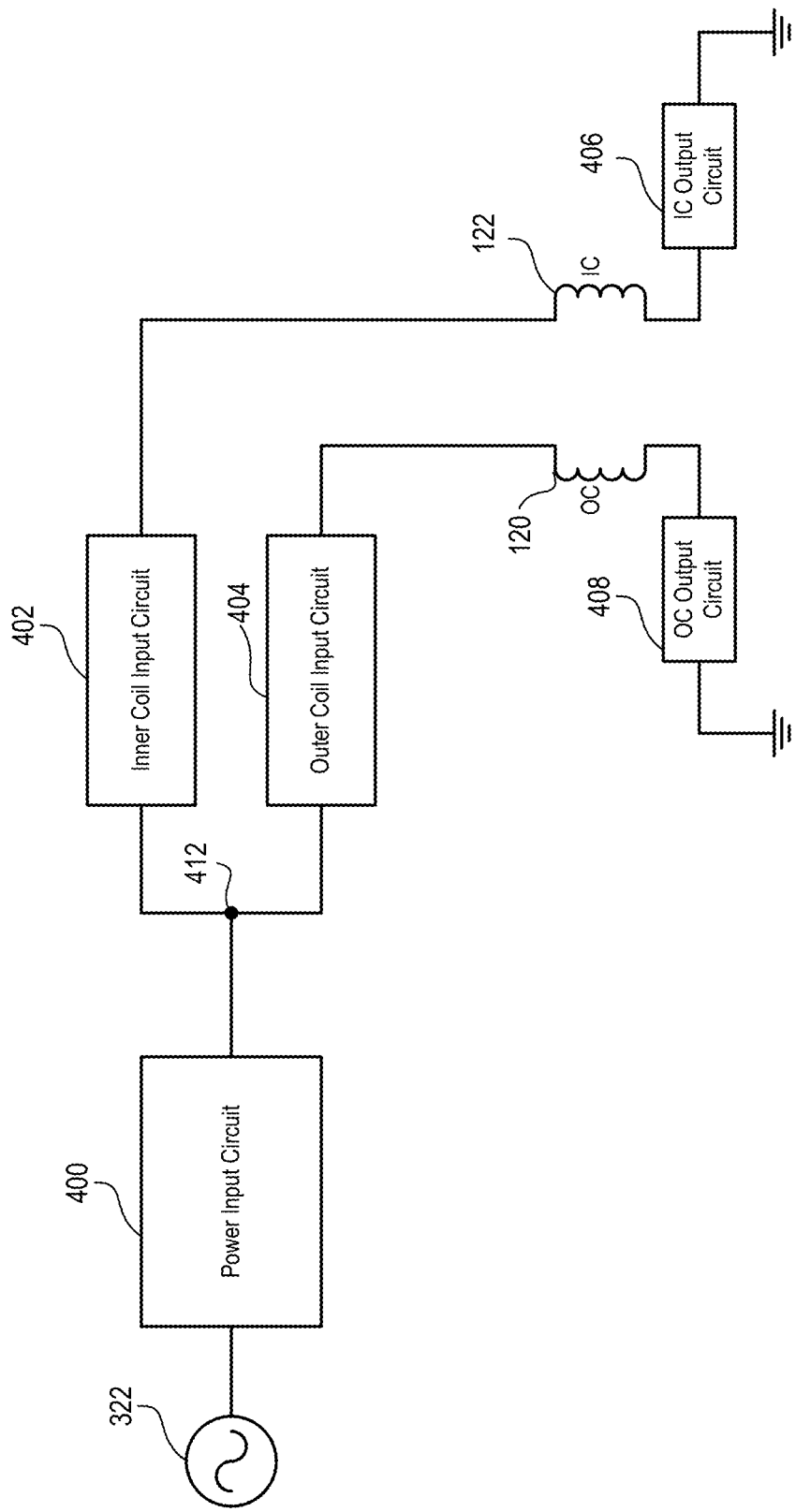
FIG. 4B is a simplified schematic illustrating components of the TCCT match circuitry, in accordance with an embodiment of the invention.

FIG. 4B is a simplified schematic illustrating components of the TCCT match circuitry, in accordance with an embodiment of the invention. As shown, the power input circuit 400 receives power from the RF power source 322. The power input circuit 400 connects to node 412. The inner coil input circuit 402 is coupled between the node 412 and the inner coil 122. The outer coil input circuit 404 is coupled between the node 412 and the outer coil 120. The inner coil 122 connects to inner coil output circuit 406, which is connected to ground. The outer coil 120 connects to outer coil output circuit 408, which is connected to ground.

Broadly speaking, the presently described TCCT match circuitry design provides for improvements in power efficiency. This is believed to be due to design optimization to minimize the effect of stray capacitance on the coil with respect to plasma. The effects of stray capacitance on RF power efficiency have been studied and described in "Power Efficiency Oriented Optimal Design of High Density CCP and ICP Sources for Semiconductor RF Plasma Processing Equipment," by Maolin Long, IEEE Transactions on Plasma Science, Vol. 34, No. 2, April 2006, which is incorporated herein by reference.

With respect to the inner coil, prior TCCT match circuit designs have included output-side inductors that increase stray capacitance and therefore reduce power efficiency. However, in embodiments presented herein, the inner coil output circuit is configured as a ground pass-through, whereas the inner coil input circuit is configured to include an inductor $L_3$. This reduces stray capacitance, therefore improving power efficiency and facilitating lower voltage on the inner coil.

With respect to the outer coil, prior TCCT match circuit designs have provided for relatively low output-side capacitance. However, in embodiments presented herein, the outer coil output circuit is configured to provide higher capacitance, which reduces impedance for a given frequency and provides for a lower voltage drop.

Table 1 shown below provides RF characterization data comparing an original top end RF design to a modified top end RF design in accordance with embodiments of the invention.

TABLE 1

| TCP = 2 kW TCCT ratio: | no plasma_R_load (ohm):[looking at input of splitter] | no plasma_X_load (ohm):[looking at input of splitter] | R_conjugate (ohm):[looking at output of T match with input being terminated by 50 ohm] | X_conjugate (ohm):[looking at output of T match with input being terminated by 50 ohm] |
|---|---|---|---|---|
| Original top end w/SF6 = 120 sccm at 10 mT ||||| 
| 1 | 0.44 | 24.624 | 1.2698 | −8.4143 |
| 0.5 | 0.42977 | 23.274 | 1.2997 | −8.6419 |
| 1.3 | 0.43723 | 23.917 | 1.2544 | −7.5901 |
| Modified top end w/SF6 = 125 sccm at 10 mT ||||| 
| 1 | 0.39092 | 47.363 | 1.5062 | −28.044 |
| 0.5 | 0.45115 | 48.718 | 1.855 | −30.524 |
| 1.3 | 0.37336 | 43.506 | 1.3897 | −24.143 |

As demonstrated by the data of Table 1, the Q value of the inner coil in an unloaded case (no plasma) for the modified top end is improved over that of the original top end. Therefore, the RF power efficiency is also improved. Thus in the unloaded case, the overall Q value of the TCP coil is improved at higher TCCT, as the outer coil dominates at lower TCCT. Additionally, the data demonstrate that the overall RF power efficiency increase in the loaded case (with plasma) is significant.

Broadly speaking, the presently disclosed TCCT match circuitry provides for high power efficiency, meaning that for a given amount of power, a higher density plasma is achieved. Furthermore, by achieving high power efficiency, the disclosed TCCT match circuitry allows for voltage levels at the coil terminals to be relatively low. The ability to run at lower voltages at the coil terminals reduces the acceleration of ions that can strike the surface of the dielectric window. The result is to reduce the particle generation caused by sputtering of particles from the dielectric window. Table 2 below shows a comparison of terminal voltages between an existing TCCT match circuit design and a TCC match circuit design in accordance with embodiments of the invention.

TABLE 2

| TCP = 2 kW | New TCCT match w/ SF6 = 125 sccm at 10 mT | | Existing TCCT match w/ SF6 = 120 sccm at 10 mT | |
|---|---|---|---|---|
| TCCT ratio: | $V_3$ (V) | $V_4$ (V) | $V_3$ (V) | $V_4$ (V) |
| 1 | 2135 | 2535 | 4596 | 3169 |
| 0.5 | 1392 | 2946 | 3040 | 3980 |
| 1.3 | 2409 | 2283 | 5000 | 2785 |

The data in Table 2 shows a measured RF voltage comparison between a TCCT match circuitry in accordance with embodiments of the invention and an existing TCCT match circuitry. The voltage $V_3$ (shown at FIG. 4A) is measured between the variable capacitor $C_5$ and the node 140, and is indicative of the voltage at the input terminals of the inner coils. The voltage $V_4$ (also shown at FIG. 4A) is measured between the output terminals of the outer coils and the capacitor $C_7$, and is indicative of the voltage at the output terminals of the outer coils.

As the data shown at Table 2 demonstrate, coil terminal voltage is significantly reduced in the TCCT match circuitry design according to embodiments of the invention. Because coil terminal voltage is reduced, embodiments of the present invention can be utilized across various conductor etch chambers to minimize dielectric window sputtering and also eliminate coil arcing caused by terminal-to-ground over voltage.

Figure 5:
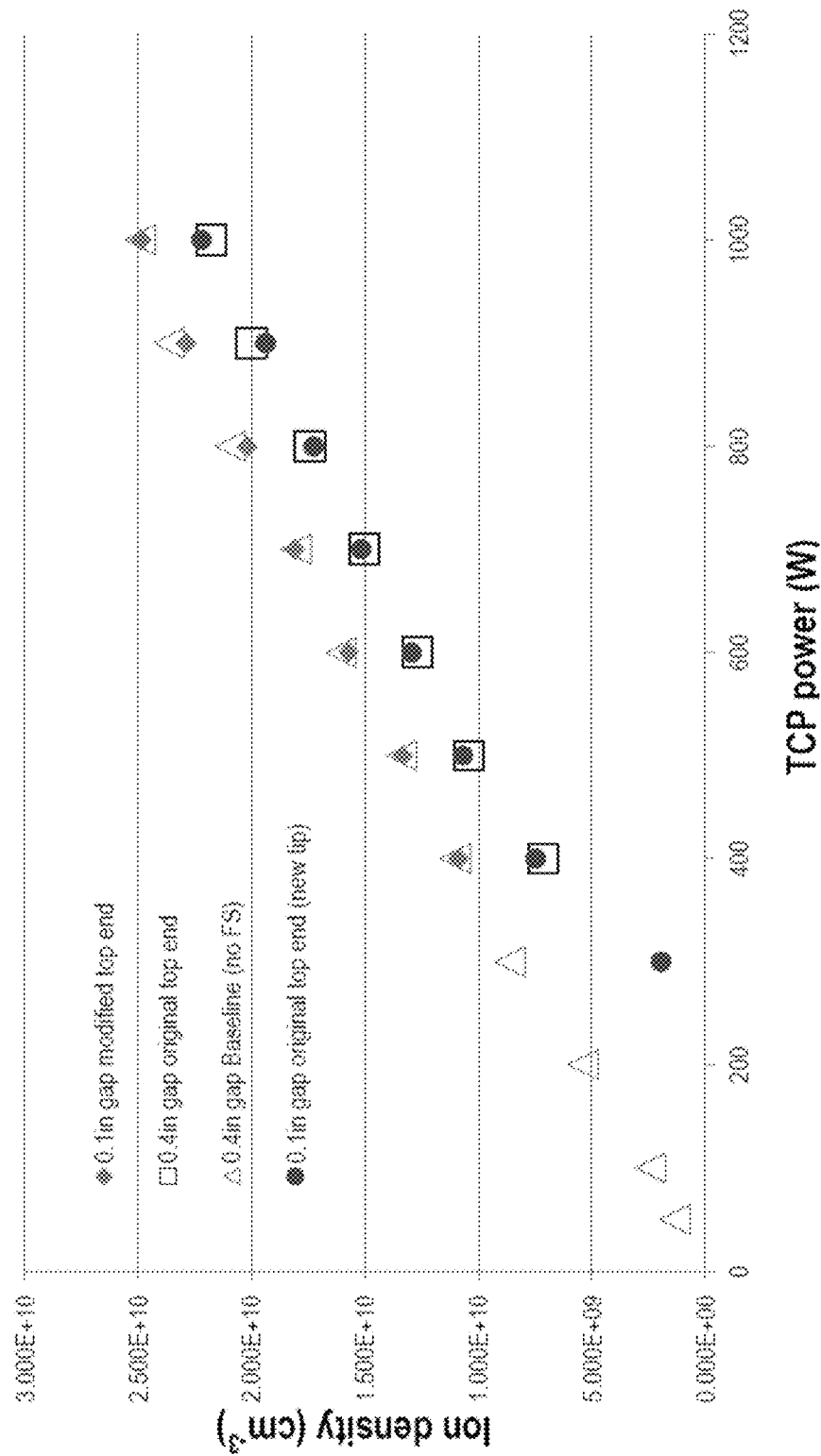
FIG. 5 is a graph showing ion density versus TCP power for various top end configurations, in accordance with embodiments of the invention.

FIG. 5 is a graph showing ion density versus TCP power for various top end configurations, in accordance with embodiments of the invention. In the graph, plots for different top end configurations are represented by different shapes. Circles correspond to a plot of an original top end having a coil-window gap of 0.1 inches. The experimental conditions are as follows: TCCT=1, SF6=50 sccm, Ar=200 sccm, Ch.P=9mT, tip=160 mm Diamonds correspond to a plot of a modified top end having a TCCT match circuitry in accordance with embodiments described herein, also having a coil-window gap of 0.1 inches. Squares correspond to a plot of an original top end having a coil-window gap of 0.4 inches. Triangles correspond to a plot of an original top end having no Faraday shield, also with a coil-window gap of 0.4 inches.

Comparing the plot for the original top end with a 0.1 inch coil-window gap (represented by circles) against the plot for the modified top end with a 0.1 inch coil-window gap (represented by diamonds), it can be seen that the modified top end RF design provides for a significantly higher power efficiency than the original top end RF design. That is, for a given TCP power, the modified top end provides for a significantly higher ion density. By providing for greater power efficiency, it is possible to achieve equivalent amounts of plasma density as prior top end TCCT match designs, but at lower power. This ability provides for improved longevity of the TCCT match circuitry, as components are subject to lower power, and also reduces particle generation from sputtering of the dielectric window as previously described.

Figure 6:
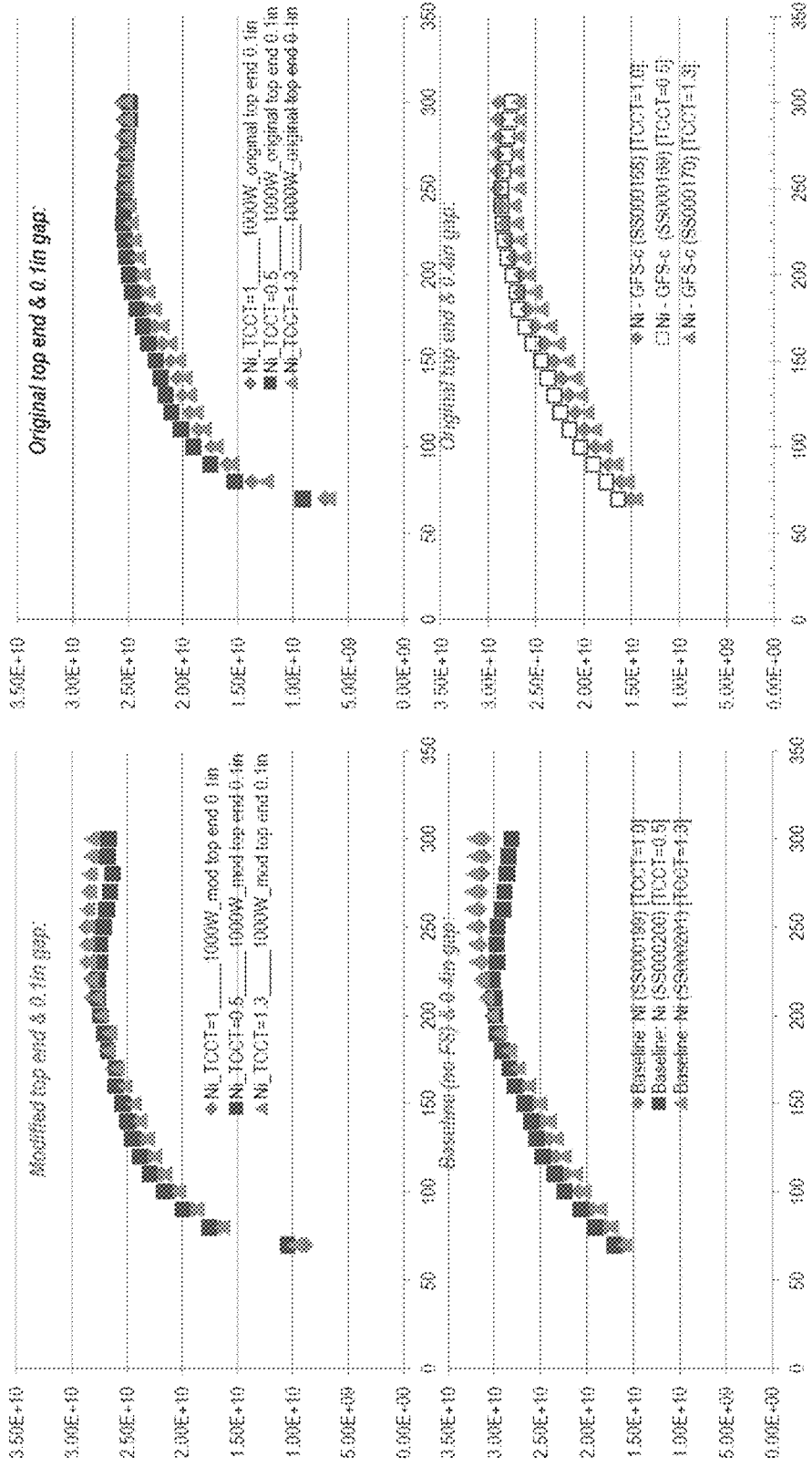
FIG. 6 illustrates four graphs, each showing ion density versus radial distance, in accordance with embodiments of the invention.

FIG. 6 illustrates four graphs, each showing ion density versus radial distance. In the graph shown at the upper right of FIG. 6, plots are shown for various TCCT values as applied to an original top end having a coil-window gap of 0.1 inches. For each plot, TCP power=1000 W. The plot indicated by diamonds corresponds to TCCT=1. The plot indicated by squares corresponds to TCCT=0.5. The plot indicated by triangles corresponds to TCCT=1.3.

In the graph shown at the upper left of FIG. 6, plots are shown for various TCCT values as applied to a modified top end having TCCT match circuitry in accordance with embodiments of the invention, and having a coil-window gap of 0.1 inches. For each plot, TCP power=1000 W. The plot indicated by diamonds corresponds to TCCT=1. The plot indicated by squares corresponds to TCCT=0.5. The plot indicated by triangles corresponds to TCCT=1.3.

In the graph shown at the lower right of FIG. 6, plots are shown for various TCCT values as applied to an original top end having a coil-window gap of 0.4 inches. The plot indicated by diamonds corresponds to TCCT=1. The plot indicated by squares corresponds to TCCT=0.5. The plot indicated by triangles corresponds to TCCT=1.3.

In the graph shown at the lower left of FIG. 6, plots are shown for various TCCT values as applied to a baseline top end with no Faraday shield, and having a coil-window gap of 0.4 inches. The plot indicated by diamonds corresponds to TCCT=1. The plot indicated by squares corresponds to TCCT=0.5. The plot indicated by triangles corresponds to TCCT=1.3.

The plots shown at FIG. 6 demonstrate that the gained plasma density resulting from incorporation of TCCT match circuitry in accordance with embodiments of the invention is more uniformly distributed across the wafer.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A match circuit for a plasma chamber, the match circuit comprising:
   a power input circuit;
   an inner coil input circuit coupled between the power input circuit and an input terminal of an inner coil, the inner coil input circuit including an inductor and a capacitor coupled in series to the inductor, the inductor connecting to the power input circuit, and the capacitor connecting to the input terminal of the inner coil, a first node being defined between the power input circuit and the inner coil input circuit;

an inner coil output circuit coupled between an output terminal of the inner coil and ground, the inner coil output circuit defining a direct pass-through connection that does not include an inductor or capacitor and is a direct connection to ground;

an outer coil input circuit coupled between the first node and an input terminal of an outer coil;

an outer coil output circuit coupled between an output terminal of the outer coil and ground, wherein the outer coil output circuit includes a second capacitor;

wherein the power input circuit includes a third capacitor coupled to an RF source, a second inductor coupled to the inner coil input circuit, a fourth capacitor coupled between the third capacitor and the second inductor, a second node being defined between the third capacitor and the fourth capacitor, and a fifth capacitor coupled between the second node and ground.

2. The match circuit of claim 1, wherein the outer coil input circuit includes a sixth capacitor.

3. The match circuit of claim 1, wherein the first node splits power from the power input circuit for distribution to the inner coil input circuit and the outer coil input circuit.

4. The match circuit of claim 1, wherein the capacitor of the inner coil input circuit defines a first variable capacitor.

5. The match circuit of claim 4, wherein the outer coil input circuit includes a second variable capacitor, the outer coil input circuit further coupled to the power input circuit via the first node.

6. The match circuit of claim 5, wherein the first and second variable capacitors providing for tuning of a ratio of currents between the inner coil and the outer coil.

7. A plasma chamber, comprising:
a chuck configured to support a substrate for plasma processing;
a dielectric window disposed over the chuck;
a TCP coil disposed over the dielectric window, the TCP coil defined by an inner coil and an outer coil;
a match circuit, including,
a power input circuit;
an inner coil input circuit coupled between the power input circuit and an input terminal of the inner coil, the inner coil input circuit including an inductor and a capacitor coupled in series to the inductor, the inductor connecting to the power input circuit, and the capacitor connecting to the input terminal of the inner coil, a first node being defined between the power input circuit and the inner coil input circuit;

an inner coil output circuit coupled between an output terminal of the inner coil and ground, the inner coil output circuit defining a direct pass-through connection that does not include an inductor or capacitor and is a direct connection to ground;

an outer coil input circuit coupled between the first node and an input terminal of the outer coil;

an outer coil output circuit coupled between an output terminal of the outer coil and ground, wherein the outer coil output circuit includes a second capacitor;

wherein the power input circuit includes a third capacitor coupled to an RF source, a second inductor coupled to the inner coil input circuit, a fourth capacitor coupled between the third capacitor and the second inductor, a second node being defined between the third capacitor and the fourth capacitor, and a fifth capacitor coupled between the second node and ground.

8. The plasma chamber of claim 7, wherein the outer coil input circuit includes a sixth capacitor.

9. The plasma chamber of claim 7, wherein the first node splits power from the power input circuit for distribution to the inner coil input circuit and the outer coil input circuit.

10. The plasma chamber of claim 7, wherein the capacitor of the inner coil input circuit defines a first variable capacitor.

11. The plasma chamber of claim 10, wherein the outer coil input circuit includes a second variable capacitor, the outer coil input circuit further coupled to the power input circuit via the first node.

12. The plasma chamber of claim 11, wherein the first and second variable capacitors providing for tuning of a ratio of currents between the inner coil and the outer coil.

13. The plasma chamber of claim 7, further comprising:
a bias match circuit connected to the chuck.

* * * * *